United States Patent [19]

Anderson

[11] Patent Number: 4,813,573
[45] Date of Patent: Mar. 21, 1989

[54] SHUTTLE ACTUATED SINGULATION APPARATUS

[75] Inventor: Richard D. Anderson, Maple Grove, Minn.

[73] Assignee: Micro Component Technology, Inc., St. Paul, Minn.

[21] Appl. No.: 51,257

[22] Filed: May 13, 1987

Related U.S. Application Data

[63] Continuation of Ser. No. 849,200, Apr. 7, 1986, abandoned.

[51] Int. Cl.⁴ .............................................. B65G 59/06
[52] U.S. Cl. .................................... 221/233; 221/236; 198/463.4; 414/224
[58] Field of Search ............... 221/123, 126, 127, 196, 221/176, 178, 225, 233–236, 266; 198/464.3, 463.4, 463.3, 531; 414/224; 29/739, 740, 741; 209/573

[56] References Cited

U.S. PATENT DOCUMENTS

| | | | |
|---|---|---|---|
| 2,283,252 | 5/1942 | Hartman et al. | 221/126 X |
| 3,016,167 | 1/1962 | Richards et al. | 221/225 X |
| 4,170,290 | 10/1979 | Frisbie et al. | 198/836 X |
| 4,228,901 | 10/1980 | Watzka et al. | 221/233 X |
| 4,234,418 | 11/1980 | Boissicat | 221/266 X |

Primary Examiner—F. J. Bartuska
Attorney, Agent, or Firm—Lawrence M. Nawrocki

[57] ABSTRACT

A shuttle-actuated singulation apparatus (10) for use in handling integrated circuit devices (16). A shuttle (39), acting to isolate or singulate an individual integrated circuit device (16) for transfer to a test apparatus, is included. A shuttle assembly (30) is carried by a splined shaft (34) for rotational movement of shuttle (39) carried thereby. The assembly (30), additionally, is moved laterally by means of a drive cable (36). Rotation of a shuttle barrel (32) and associated upward pivoting of shuttle projectiles (42) carried by barrel (32) effects engagement of a bell crank (70) which, in turn, engages a belt drive mount (82) carrying a drive belt (80). The drive belt (80), thereafter, is engaged with an integrated circuit device (16) to impel the device (16) out of a track (12) in which it is received. The engagement of the shuttle projectiles (42) with a shoulder (72) of the bell crank (70) pivots the belt drive mount (82), thereby overcoming belt drive mount biasing spring (90) which normally retains the belt drive mount (82) in its original position. A stop (60) associate with each track (12) is also engaged by upward rotation of the shuttle projectiles (42). Engagement of the stop (60) by projectiles (42) overcomes stop biasing spring (62) to allow the belt drive (80) to push an integrated circuit device (16) out of the track (12) and into the shuttle assembly (30). The shuttle assembly (30) is then moved laterally to a position in alignment with a chute (18) and shuttle (39) rotated to a second position where the integrated circuit device (16) is expelled from the shuttle by means of a spring (48) into the common test site chute (18).

20 Claims, 2 Drawing Sheets

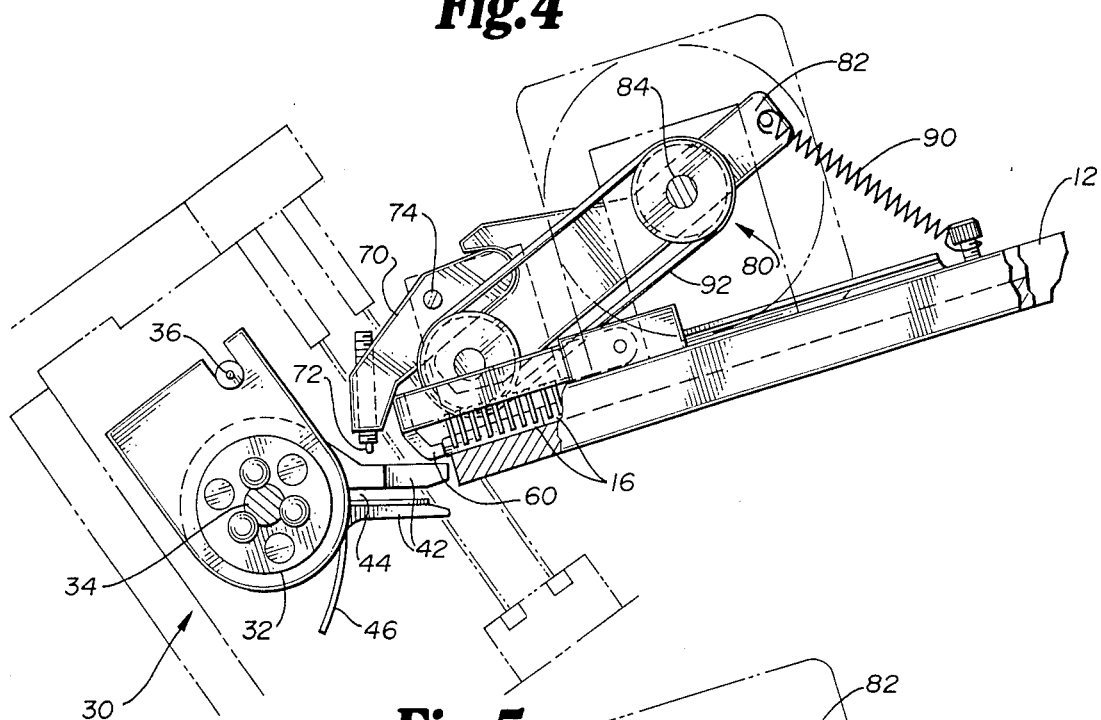
Fig. 4
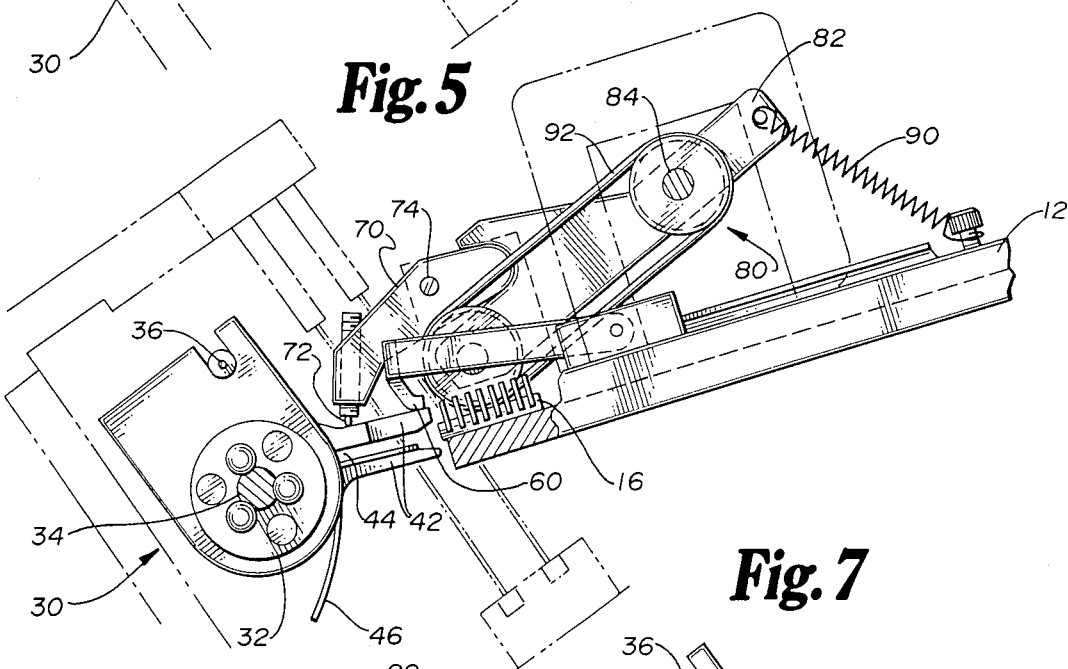
Fig. 5
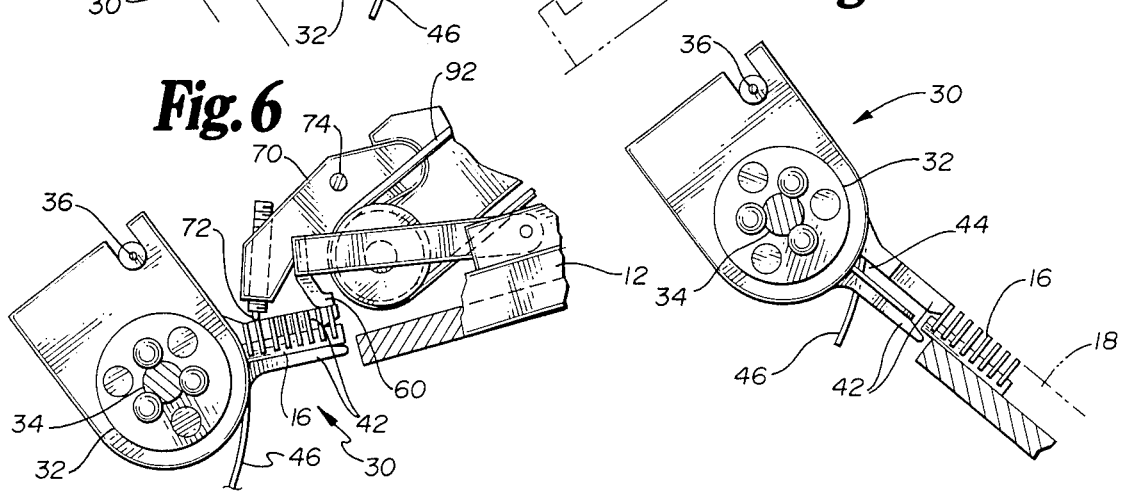
Fig. 6
Fig. 7

SHUTTLE ACTUATED SINGULATION APPARATUS

This application is a continuation, of application Ser. No. 849,200, filed Apr. 7, 1986 now abandoned.

TECHNICAL FIELD

The present invention is related to the field of integrated circuit handling devices and related testing apparatus. The invention specifically deals with mechanical apparatus adapted to isolate individual integrated circuit devices (singulation) within a feed handler and to transfer them to a test site apparatus for testing.

BACKGROUND OF THE INVENTION

Various devices for handling integrated circuits have been devised. Many of these devices include means for moving a series of integrated circuit devices down a track, at the bottom of which they are isolated and subsequently transferred to a test site apparatus. Much of the prior art has utilized a continuous chain mechanism for transfer of the integrated circuit devices from the system of tracks to testing apparatus. Another means of maneuvering or tranferring the integrated circuit devices has been by air pressure.

One problem with these prior art structures has been misalignment of the integrated circuit devices within the continuous chain or dropping of the devices from the continuous chain or from an air pressure actuated transfer apparatus.

Many prior art devices for handling and isolating the integrated circuits have utilized means for approximating the operational environmental conditions in which the devices perform. These conditions can include temperature and humidity variations. Such environmental conditions have been incorporated into some prior art structures to prepare the integrated circuit devices for eventual testing. Solenoid actuated handlers can be adversely affected by these conditions.

Various means for stopping integrated circuit devices along the track prior to being handled or transferred to the test site apparatus have been utilized in the prior art. All of such systems require additional apparatus within the track system or within the handler to isolate or singulate an integrated circuit device prior to being fed into a test site. This singulation is necessary to allow an individual integrated circuit device to be tested and the quality thereof indicated without jamming the test site.

Another problem in the prior art has been the lack of adaptability to size of electrical components to be tested. This has required separate handlers be used with different types and sizes of devices. In some cases, this has required separate handler chassis. An apparatus that could provide adaptability to size and one that would be mountable on a standard handler chassis would be an improvement over the prior art.

It is to these problems in the prior art that the invention of the present application is directed.

SUMMARY OF THE INVENTION

The present invention is a shuttle actuated singulation apparatus for handling integrated circuit devices and transferring them from a track carried by an inclined platen to a test site apparatus. It includes a shuttle as means for transferring the integrated circuit devices from the track to the test site apparatus. The invention includes means for laterally moving a single shuttle across a plurality of tracks as necessary. The shuttle is rotatable relative to an axis of a shaft to which it is mounted to permit pick-up of integrated circuit devices from the tracks and their deposit in a chute to the test site. The shuttle also moves laterally for registration at each track. In this manner, the single shuttle can service a plurality of tracks.

Also included in this apparatus are means for urging the lowermost integrated circuit device down the track and into the shuttle. Movement of the integrated circuit devices down the track can be precluded until such time as the shuttle is in position to receive the integrated circuit device from that particular track. Additionally included can be means for expelling the integrated circuit devices from the shuttle into a test site intake chute.

Rotation of the shuttle can be effected by rotation of a splined shaft to which the shuttle is mounted. Lateral movement of the shuttle can be accomplished by cable drive means that are secured to the shuttle. The cable drive means pull the shuttle longitudinally along the splined shaft. This allows for the shuttle to service one of a plurality of tracks carried by an inclined platen.

The means for moving the integrated circuit devices along the track and into the shuttle can include a belt drive that, when actuated, engages a surface of the lowermost integrated circuit device in the track and pushes the device into the shuttle. This action occurs when the shuttle is in position to receive the integrated circuit device from a particular track. Each track has associated therewith such a belt drive.

When the belt drive is in its normal, or unengaged position, a spring, associated with a belt drive mount, biases the belt drive mount, on which the belt drive is received, into a position wherein the integrated circuit devices are not engaged by the continuous driving belt. As the shuttle is rotated into registration with the track for pick-up of an individual integrated cicuit device, movement of the shuttle actuates linkages resulting in a pivoting of the belt drive mount to overcome the spring biasing means. Only then is the belt drive in engagement with an integrated circuit device on the track.

The spring biasing means of the belt drive mount is overcome by employment of a bell crank which, when pivoted by being engaged by the upward rotating shuttle, engages the mount. This action in turn overcomes the belt drive mount spring biasing means and allows engagement of the belt drive with an integrated circuit device on the track.

Integrated circuit devices can, in one embodiment, be expelled from the shuttle into the test site intake chute by the rotation of the shuttle downwardly at the intake chute site to cause a spring that is mounted within a recess in the shuttle to push the integrated cicuit device out of the shuttle and into the test site intake chute.

The integrated circuit devices are normally retained within a track by means of a stop, mounted above the track, which, when held in its engaged position by spring biasing means, arrests the movement of the integrated circuits down the track. The spring biasing means is overcome by the upward rotation of the shuttle to its pick-up position at a track, the shuttle abutting and lifting the stop to allow the lowermost integrated circuit device to be released and driven into the shuttle by the belt drive means.

The invention of this application is thus an improved integrated circuit device shuttle actuated singulation handler. More specific advantages will become apparent with reference to the detailed description of the invention, claims, and appended drawings.

BRIEF DESCRIPTION OF THE DRAWINGS

FIG. 4 is a schematic view showing the shuttle starting its upward rotation, the stop in place arresting the movement of the lowermost integrated circuit device down the track, and the belt drive in an unengaged position;

FIG. 5 is a schematic view showing the shuttle in its uppermost position abutting a shoulder of a bell crank and raising the stop;

FIG. 6 is a schematic view showing the shuttle in its uppermost position with the integrated circuit device within the shuttle; and FIG. 7 is a schematic view showing the shuttle rotated downwardly to the test site intake chute with the integrated circuit device being expelled from the shuttle by action of the shuttle-carried spring.

DETAILED DESCRIPTION OF THE INVENTION

Figure 1:
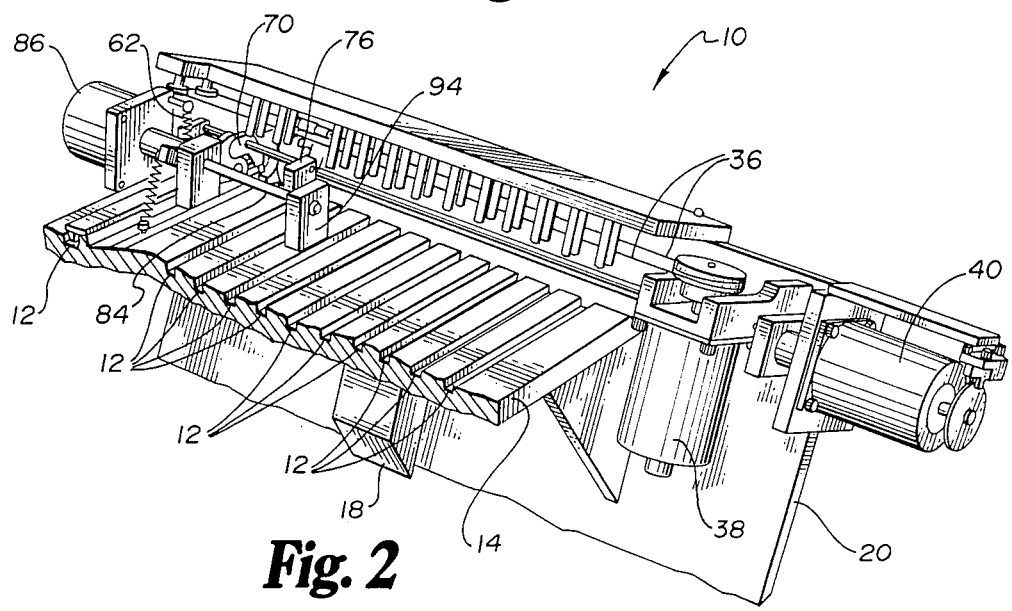
FIG. 1 is a perspective view showing a shuttle actuated integrated circuit device singulation apparatus in accordance with the present invention.

Referring now to the drawings wherein like reference numerals denote like elements throughout the several views, FIG. 1 illustrates generally a shuttle actuated integrated circuit device singulation apparatus 10 in accordance with the present invention. Shown are a plurality of tracks 12 formed in an inclined platen 14 which is fixedly mounted to a structure supporting plate 20. Integrated circuit devices 16 pass down the tracks 12. Individual integrated circuit devices 16 can be inserted into a track 12 by a variety of means. Once the integrated circuit devices are positioned, with the use of a track guide 22, within a track 12, they move by gravity down the track 12 and are released by means of singulation apparatus (to be described hereinafter) and transferred to a common test site intake chute 18 to reach a test site (not shown). A shuttle assembly 30, shown enlarged in views 3, 4, 5, 6, and 7, and mounted upon a splined shaft 34, transfers the integrated circuit devices from the singulation apparatus 10 to the test site intake chute 18. Cable drive means 36, driven by a cable drive motor 38, provide lateral movement of the assembly 30 by pulling the assembly 30 longitudinally along the splined shaft 34 for registration of shuttle 39 with one of individual tracks 12. Rotation of the splined shaft 34, by means of a motor 40, results in rotation of the shuttle 39 with respect to an axis of spline shaft 34.

The shuttle 39, shown in more detail in FIGS. 3 through 7, can include a rotatable central barrel 32 that rotates upon rotation of the spline shaft 34. Shuttle projectiles 42 act as guides projecting above and below an integrated circuit device receiving slot 44. Integrated circuit devices 16 enter the shuttle receiving slot 44 for transfer into the test site chute 18. Entry effected after rotation of the shuttle 39 into its pick-up position as illustrated in FIG. 5. With the shuttle 39 in this position, slot 44 is in registration with one of tracks 12.

Figure 2:
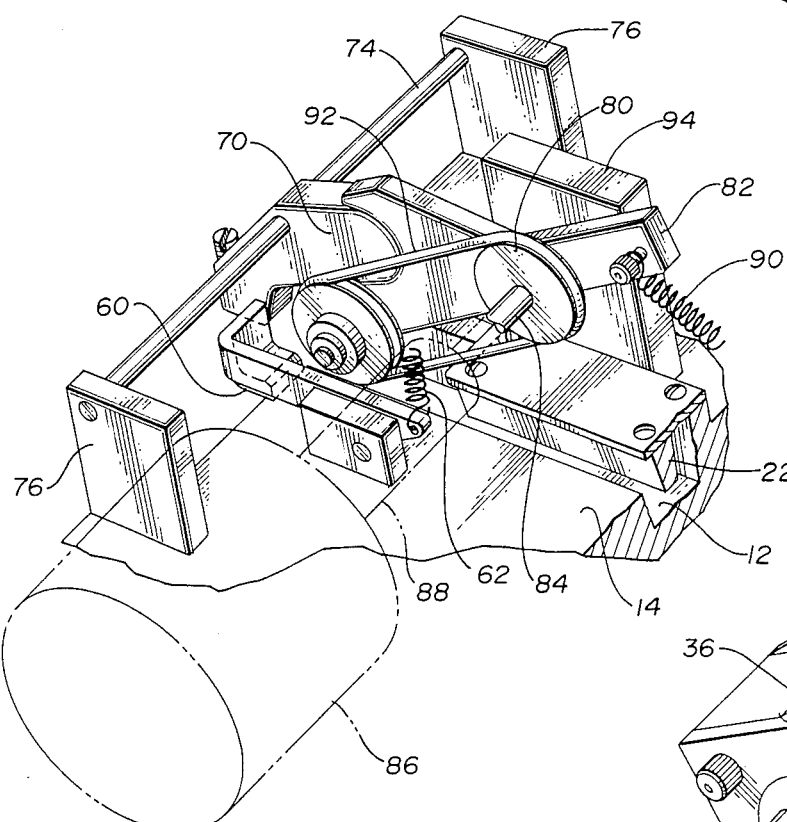
FIG. 2 is an enlarged view of the apparatus at an individual track showing a belt drive and belt drive mount with associated spring biasing means.
Figure 3:
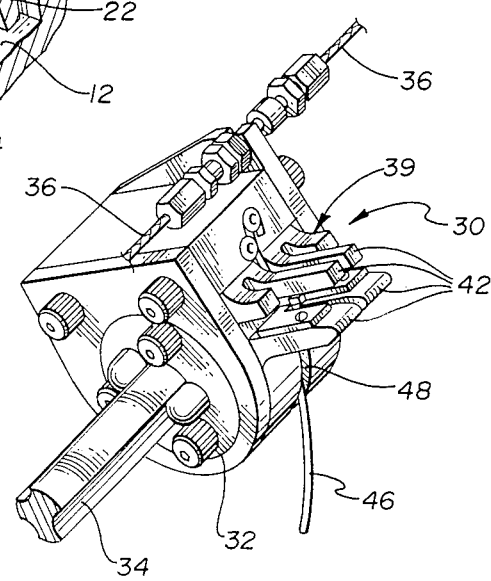
FIG. 3 is an enlarged view of the shuttle as mounted on a splined shaft and with cable drive means secured thereto.

Rotation of the splined shaft 34 carries the shuttle 39 upwardly to bring shuttle projectiles 42 into engagement with a stop 60 associated with one of tracks 12. The stop 60, in its normal or first position, retains integrated circuit devices 16 within its respective track 12 as best seen in FIG. 4. The stop 60, shown in phantom in FIG. 2, is pivotally mounted above the track 12 and is maintained in its first, engaged, position by action of a stop biasing spring 62. The biasing is overcome by the upward rotation of the shuttle 39 and engagement of shuttle projectiles 42 with stop 60. The shuttle projectiles 42 engage and lift the stop 60 to its second, or unengaged, position as seen in FIG. 5.

In addition to engaging and lifting the stop 60, upward rotation of the shuttle 39 also results in the engagement of the shuttle 39 with a bell crank shoulder 72 as shown in FIGS. 5 and 6. A bell crank 70, mounted on a shaft 74 supported over the inclined platen 14 by means of shaft mounts 76, pivots upon engagement by the shuttle assembly 30 with the bell crank shoulder 72.

Pivoting the bell crank 70 with respect to the shaft 74 changes the position of a belt drive mount 82, which cooperates with the bell crank 70. The belt drive mount 82 pivots with respect to a shaft 84 supported above the inclined platen 14 by mounts 94.

Associated with belt drive shaft 84 is a motor 86 and motor shaft 88 shown in phantom in FIG. 2. Pivoting the bell crank 70 overcomes belt drive mount spring biasing means 90. Overcoming the belt drive mount spring biasing means 90 effects engagement of a belt drive 80 received on the belt drive mount 82 with an integrated circuit device 16 within an associated track 12. A belt drive 80, belt drive mount 82, bell crank 70 and stop 60 are mounted above and associated with each track 12.

A driving belt 92 of the belt drive 80, upon the belt 92 being pivoted as is the belt drive mount 82, moves downwardly to engage the lowermost integrated circuit device 16 in the track 12 therebelow. The driving motion of the belt 92 urges the integrated circuit device 16 into the shuttle assembly 30, as seen in FIGS. 5 and 6.

A single shuttle assembly 30 services the entire singulation apparatus 10. One of the series of driving belts 92, each being associated with one of the tracks 12, comes into contact with an integrated circuit device 16 in its corresponding track 12 as the shuttle assembly 30 services a particular track. Once an integrated circuit device 16 is deposited within the shuttle assembly 30, rotation of the splined shaft 34, after the assembly 30 has been moved laterally into alignment with chute 18, rotates the shuttle 39 and its central barrel 32 and projectiles 42 downward. This rotation, in turn, redirects movement of the integrated circuit device 16 from the track 12 to the common test site intake chute 18.

During the rotation of the shuttle 39 effected by the rotating splined shaft 34, a spring 46, recessed within the barrel 32, appears to emerge from a slot 48. The relative positioning of spring 46 with respect to projectiles 42 is adjusted outwardly to push the integrated circuit device 16 out of the shuttle 39 and into the test site intake chute 18. This action expels the integrated circuit device 16 from the shuttle 30 and thus completes the transfer of the device 16 from the track 12 to the test site intake chute 18.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for singulating integrated circuit devices from a track and delivering the devices to a laterally spaced test site intake chute, comprising:
   (a) a shuttle;
   (b) means for laterally moving said shuttle between positions in registration with the track and the chute;
   (c) means for rotating said shuttle between an up disposition wherein it is registered with the track and a down disposition wherein it is registered with the chute;
   (d) belt drive means for engaging a surface of an integrated circuit device within the track to push the device along the track into said shuttle, said belt drive means including spring means for biasing a belt drive mount, over which an endless belt is received, away from engagement with an integrated circuit device;
   (e) means for arresting movement of integrated circuit devices down the track; and
   (f) means for expelling the integrated circuit devices from said shuttle into the chute.

2. Apparatus as defined in claim 1, wherein said rotating means further comprises a splined shaft on which said shuttle is mounted.

3. Apparatus as defined in claim 1, wherein said lateral movement means comprises cable means for driving said shuttle along a splined shaft about the axis of which it is rotatably mounted.

4. Apparatus as defined in claim 1, further comprising means for overcoming said spring biasing means and for engaging said belt drive mount with an integrated circuit device in the track.

5. Apparatus as defined in claim 4, wherein said means for overcoming said spring biasing means comprise a bell crank for pivoting said belt drive mount on a pivot.

6. Apparatus as defined in claim 1, wherein said means for arresting movement of integrated circuit devices down the track further comprise a stop pivotably mounted above each of at least one track.

7. Apparatus as defined in claim 6, further comprising means for normally holding said stop in an engaged position.

8. Apparatus as defined in claim 6, wherein said stop is lifted from its engaged position when engaged by said shuttle rotating to its up disposition.

9. Apparatus as defined in claim 1, wherein said means for expelling said integrated circuit device from said shuttle into the chute comprises a spring recessibly mounted on said shuttle for pushing integrated circuit devices out of said shuttle when said shuttle is rotated downwardly toward the chute.

10. Apparatus for singulating integrated circuit devices from at least one track mounted on an inclined platen and delivering the integrated circuit devices into a test site chute, comprising:
    (a) a first shaft mounted above the inclined platen;
    (b) a bell crank pivotably mounted on said first shaft above each of said at least one track;
    (c) a belt drive mount engageable by an associated bell crank and pivotably mounted above one of said at least one track;
    (d) a continuous driving belt received on an associated belt drive mount above a corresponding of said at least one track for engaging an integrated circuit device within the track;
    (e) stop means provided to alternately occlude and withdraw from an exit from each track;
    (f) a second shaft mounted above the inclined platen;
    (g) a shuttle mounted to said second shaft and disposed for movement between positions in registration with said at least one track and the chute; and
    (h) means for moving said shuttle between said positions.

11. Apparatus as defined in claim 10, wherein said stop means comprises a member pivotably mounted above said at least one track and moveable between a first, engaged position, and a second, retracted position.

12. Apparatus as defined in claim 11, wherein said stop means further includes biasing means normally holding said stop in said first position in engagement with an integrated circuit device.

13. Apparatus as defined in claim 11, wherein said stop means further includes means for overcoming said biasing means to move said stop to said second position out of engagement with the integrated circuit device.

14. Apparatus as defined in claim 13, wherein said overcoming means comprises said shuttle, movement of said shuttle upwardly toward a position in registration with a track functioning to engage said stop means and move said stop means to its second, retracted, position.

15. Apparatus as defined in claim 10, wherein said moving means further comprises means for rotating said second shaft to raise said shuttle into engagement with a shoulder carried by a bell crank associated with one of said at least one track.

16. Apparatus as defined in claim 15, wherein engagement of said shuttle with a shoulder of a bell crank pivots said bell crank to actuate said associated belt drive mount.

17. Apparatus as defined in claim 16, wherein each of the at least one belt drive mount is biased out of engagement with an integrated circuit device within an associated track.

18. Apparatus as defined in claim 17, wherein engagement of a belt drive mount by said associated bell crank overcomes said spring biasing means to allow engagement of an associated continuous driving belt with an integrated circuit device within the associted track.

19. Apparatus as defined in claim 18, wherein engagement of said continuously driving belt drive with an integrated circuit device within the track pushes the integrated circuit device into said shuttle.

20. Apparatus as defined in claim 10, wherein said moving means further comprises cable drive means for lateral movement of said shuttle.

* * * * *